United States Patent
Bettencourt et al.

(10) Patent No.: US 12,278,600 B2
(45) Date of Patent: Apr. 15, 2025

(54) AMPLIFIER BIAS CIRCUIT

(71) Applicant: Raytheon Company, Waltham, MA (US)

(72) Inventors: John P. Bettencourt, Boxford, MA (US); Valery S. Kaper, Winchester, MA (US); Steven M. Lardizabal, Westford, MA (US)

(73) Assignee: Raytheon Company, Arlington, VA (US)

( * ) Notice: Subject to any disclaimer, the term of this patent is extended or adjusted under 35 U.S.C. 154(b) by 607 days.

(21) Appl. No.: 17/646,162

(22) Filed: Dec. 28, 2021

(65) Prior Publication Data

US 2023/0208364 A1   Jun. 29, 2023

(51) Int. Cl.
| H03F 1/22 | (2006.01) |
| H03F 3/04 | (2006.01) |
| H03F 3/193 | (2006.01) |
| H03F 1/30 | (2006.01) |

(52) U.S. Cl.
CPC ............. *H03F 3/193* (2013.01); *H03F 1/223* (2013.01); *H03F 1/301* (2013.01); *H03F 1/302* (2013.01); *H03F 2200/451* (2013.01)

(58) Field of Classification Search
CPC .. H03F 3/193; H03F 2200/451; H03F 1/0261; H03F 1/301; H03F 1/223; H03F 1/22; H03F 2200/294; H03F 3/04; H03F 1/302; H03F 2200/18; G05F 3/262
USPC .................................................. 330/296, 310
See application file for complete search history.

(56) References Cited

U.S. PATENT DOCUMENTS

| 2,606,319 | A | | 8/1952 | Bettencourt |
| 4,896,121 | A | | 1/1990 | Larson |
| 5,793,194 | A | | 8/1998 | Lewis |
| 5,889,429 | A | | 3/1999 | Kobayashi et al. |
| 5,892,400 | A | | 4/1999 | Van Saders et al. |
| 6,114,901 | A | | 9/2000 | Singh et al. |
| 6,211,659 | B1 | | 4/2001 | Singh |
| 6,304,130 | B1 | | 10/2001 | Poulin et al. |
| 6,965,270 | B1 | * | 11/2005 | Ross ........................ H03F 1/223 |
| | | | | 330/296 |
| 6,977,553 | B1 | * | 12/2005 | Jin .......................... H03G 1/007 |
| | | | | 330/288 |
| 7,443,241 | B2 | * | 10/2008 | Fong ..................... H03G 1/0029 |
| | | | | 330/254 |

(Continued)

FOREIGN PATENT DOCUMENTS

| AU | 2019206111 A1 | 8/2019 |
| CN | 110333751 A | 10/2019 |

(Continued)

OTHER PUBLICATIONS

Gray et al., *Analysis and Design of Analog Integrated Circuits*, Fourth Edition Book; New York, John Wiley & Sons, Inc.; Jan. 2001; 445 Pages (Part 1 of 5).

(Continued)

*Primary Examiner* — Khanh V Nguyen

(57) ABSTRACT

Methods and apparatus for an amplifier including first and second transistors coupled in a stacked configuration with first and second current mirrors to provide respective bias signals to the amplifier transistors. A reference transistor is coupled to the first and second current mirrors for referencing the bias signals together.

20 Claims, 4 Drawing Sheets

(56) References Cited

U.S. PATENT DOCUMENTS

| | | | |
|---|---|---|---|
| 7,737,790 B1* | 6/2010 | Chen | H03F 1/223 |
| | | | 330/296 |
| 7,928,804 B2 | 4/2011 | Yamamoto et al. | |
| 8,198,942 B1 | 6/2012 | Bettencourt | |
| 8,854,140 B2* | 10/2014 | Bettencourt | H03F 1/301 |
| | | | 330/288 |
| 9,184,716 B2* | 11/2015 | Ding | H03F 1/223 |
| 10,250,199 B2 | 4/2019 | Klaren et al. | |
| 10,277,176 B2 | 4/2019 | Bettencourt et al. | |
| 10,447,208 B2 | 10/2019 | Bettencourt et al. | |
| 10,601,414 B2* | 3/2020 | Mou | H03F 1/223 |
| 10,819,290 B2 | 10/2020 | Ranta et al. | |
| 2009/0009252 A1 | 1/2009 | Fong et al. | |
| 2010/0039168 A1 | 2/2010 | Bettencourt | |
| 2018/0083578 A1 | 3/2018 | Klaren et al. | |

FOREIGN PATENT DOCUMENTS

| | | |
|---|---|---|
| TW | I472164 B | 2/2015 |
| TW | I514107 B | 12/2015 |
| WO | WO 98/38733 21 | 9/1998 |
| WO | WO 2006/007140 A1 | 1/2006 |
| WO | WO 2017/160417 A1 | 9/2017 |
| WO | WO 2018/063982 A1 | 4/2018 |
| WO | WO 2019/118199 A1 | 6/2019 |

OTHER PUBLICATIONS

Gray et al., *Analysis and Design of Analog Integrated Circuits*, Fourth Edition Book; New York, John Wiley & Sons, Inc.; Jan. 2001; 100 Pages (Part 2 of 5).

Gray et al., *Analysis and Design of Analog Integrated Circuits*, Fourth Edition Book; New York, John Wiley & Sons, Inc.; Jan. 2001; 100 Pages (Part 3 of 5).

Gray et al., *Analysis and Design of Analog Integrated Circuits*, Fourth Edition Book; New York, John Wiley & Sons, Inc.; Jan. 2001; 100 Pages (Part 4 of 5).

Gray et al., *Analysis and Design of Analog Integrated Circuits*, Fourth Edition Book; New York, John Wiley & Sons, Inc.; Jan. 2001; 144 Pages (Part 5 of 5).

Scheinberg, "High-Speed GaAs Operational Amplifier;" Proceedings of IEEE Journal of Solid-State Circuits, vol. SC-22, No. 4; Aug. 1987; 6 Pages.

PCT International Search Report and Written Opinion dated Mar. 30, 2023 for International Application No. PCT/US2022/051128; 15 Pages.

\* cited by examiner

AMPLIFIER BIAS CIRCUIT

BACKGROUND

As is known in the art, a consideration for any Radio Frequency (RF) transistor amplifier design is the establishment of stable DC operating conditions. Such conditions affect many of the amplifier performance characteristics. e.g., gain, frequency response, noise, linearity, and efficiency. Also the DC operating conditions, e.g., quiescent drain current, should be predictable and invariant with respect to temperature, power supply and process variations. Setting this quiescent drain current (Id) for a Field Effect Transistor (FET) type amplifier as shown in FIG. 1, is usually accomplished by adjusting the DC voltage Vg supplied to the gate of the transistor (Q1). Although in principle Vg can be determined readily from the Id versus Vg transfer characteristic of a typical device, inherent sensitivities of the FET characteristics to fabrication process and temperature preclude use of a fixed Vg.

As is also known in the art, a commonly used DC biasing element in analog circuit design is a current mirror such as that described in a book by Paul R. Gray and Robert G. Meyer, entitled Analysis and Design of Analog Integrated Circuits, $3^{rd}$ ed., New York: Wiley, 1993. FIG. 2 is a schematic representation of a conventional current mirror for D-mode GaAs MESFET operational amplifiers demonstrated by Scheinberg, see N Scheinberg, Design of high speed operational amplifiers with GaAs MESFETs, procs 1987 IEEE ISCAS (Philadelphia). May 1987, pp 193-198 and C. Tamazou and D. Haigh, "Gallium Arsenide Analog Integrated Circuit Design Techniques," Chapter 8 in "Analogue IC design: the current-mode approach", Edited by C. Toumazou, F. J. Lidgey & D. G. Haigh. London: Peter Peregrinus Ltd. 1990. By appropriately sizing; i.e., widths of the transistors Q1 and Q2, the current mirror allows one to set stable and controllable current ID2 in the main circuit transistor Q2. Here, the current ID2 "mirrors" (i.e., is proportional to) the reference current Iref. One element to the operation of the current mirror is availability of a stable reference current. Iref. This relationship of the currents is shown by the following equation.

$$ID2 = (\text{Width } Q2/\text{Width } Q1) Iref$$

Note that as long as Q1 and Q2 are fabricated in proximity to each other on the same chip, the relationship between the currents is maintained regardless of process variation, most notably voltage threshold (Vt) variations. The above circuit in FIG. 2 can be easily implemented for controlling drain current in a high efficiency, high powered RF amplifier.

FIG. 3 shows a simplified schematic implementation with appropriate inductor and capacitors connected to an RF amplifier FET(s) Q2. A necessity for high power and high efficiency RF amplifiers is that the FET source potentials need to be tied directly to ground reference, also depicted in FIG. 3 by showing Vss tied to ground potential. Also note that Vss1 is more negative than ground potential where the drains of Q1, Q2 and Q3 are more positive than ground potential.

In the absence of a bias circuit that compensates for process variations, some means for adjusting the gate voltage Vg preferably on a per amplifier basis has to be implemented to ensure that quiescent drain current Id is set near the nominal target value. Typical implementations include: supplying externally an individual Vg voltage to each amplifier; adding a resistor ladder network on chip to generate several candidate Vg voltages from a fixed, supply voltage; screening and dividing parts into several Vg bins. However, these options require some level of testing to determine first how each part or a group of parts has to be biased. Then assembly is tailored to that particular part or group of parts. These steps add significant time and cost to the product. One of the goals of a DC bias circuit is to circumvent the need for these Vg bins. Examples of patents for these types of circuits are: U.S. Pat. Nos. 5,889,429; 6,304,130; 6,114,901; 5,793,194; 4,896,121; 7,928,804, 8,854,140, all of which are incorporated herein by reference.

Stacked transistor RF amplifier topologies are commonly used to enhance performance over single transistor methods. Balanced cascode and classic cascode stacked transistor FET amplifiers require repeatable DC drain current biasing points as well as proper distribution of DC supply voltages across the transistors drains for proper RF operation.

SUMMARY

Stacked FET amplifier DC quiescent current and voltage conditions are typically determined by resistor divider network or tunable power supplies requiring continuous modifications on a per amplifier basis due to inherent process variations in semiconductor technologies. It is very desirable to set DC conditions without the need for continuous modifications of networks or supply voltages.

Embodiments of the disclosure provide methods and apparatus for a cascode and stacked FET RF amplifier having a two-stage depletion mode current mirror where a process insensitive reference current is mirrored into the cascode stacked FET amplifier. With this arrangement, a source reference potential for common gate of the top FET in the stack for the amplifier circuit is established.

In embodiments, a bias circuit is based on using first and second current mirrors for setting amplifier quiescent control. A first mirror establishes a current control signal to the gate electrode of the lower or common source FET of the amplifier. Also, a voltage output of the first mirror goes to a reference FET for establishing the source potential for the common gate reference in the second mirror circuit. In embodiments, the common gate reference FET in the second mirror circuit has a drain current from a second fixed current reference. The output of the second current mirror may go to the top or common gate FET in the cascode or stacked FET network.

In one aspect, a circuit comprises: an amplifier including first and second transistors coupled in a stacked configuration; a first current mirror having a first control loop and a first mirror transistor coupled to a first terminal of the first transistor to provide a first bias control signal; a second current mirror having a second control loop and a second mirror transistor coupled to a first terminal of the second transistor to provide a second bias control signal; and a reference transistor coupled to the first and second current mirrors.

A circuit can further include one or more of the following features: the first current mirror includes the first mirror transistor, a first fixed current source, and a first follower transistor coupled to the first mirror transistor in a follower configuration, the second current mirror includes the second mirror transistor, a second fixed current source, and a second follower transistor coupled to the second mirror transistor in a follower configuration, the reference transistor is coupled to the first mirror transistor and the second mirror transistor, the first control loop further includes at least one diode or a plurality of diodes, an output of the first current mirror is configured to establish a source potential for a common gate reference of the second current mirror, the common gate reference of the second mirror has a drain current from the second fixed current source, the amplifier comprises a depletion mode FET amplifier, and/or the amplifier comprises an RF amplifier.

In another aspect, a method comprises: employing an amplifier including first and second transistors coupled in a stacked configuration; employing a first current mirror having a first control loop and a first mirror transistor coupled to a first terminal of the first transistor to provide a first bias control signal; employing a second current mirror having a second control loop and a second mirror transistor coupled to a first terminal of the second transistor to provide a second bias control signal; and employing a reference transistor coupled to the first and second current mirrors.

A method can further include one or more of the following features: the first current mirror includes the first mirror transistor, a first fixed current source, and a first follower transistor coupled to the first mirror transistor in a follower configuration, the second current mirror includes the second mirror transistor, a second fixed current source, and a second follower transistor coupled to the second mirror transistor in a follower configuration, the reference transistor is coupled to the first mirror transistor and the second mirror transistor, the first current loop further includes at least one diode, an output of the first current mirror is configured to establish a source potential for a common gate reference of the second current mirror, the common gate reference of the second mirror has a drain current from the second fixed current source, the amplifier comprises a depletion mode FET amplifier, and/or the amplifier comprises an RF amplifier.

In embodiments, diodes in second source follower can comprise one or a plurality of diodes. In some embodiments, one or more diodes can be replaced by one or more resistors.

In a further aspect, a circuit comprises: an input terminal to receive an RF input signal; an output terminal to output an RF output signal; and a means for amplifying the RF input signal and generating the RF output signal.

BRIEF DESCRIPTION OF THE DRAWINGS

The foregoing features of this disclosure, as well as the disclosure itself, may be more fully understood from the following description of the drawings in which.

DETAILED DESCRIPTION

Figure 1:
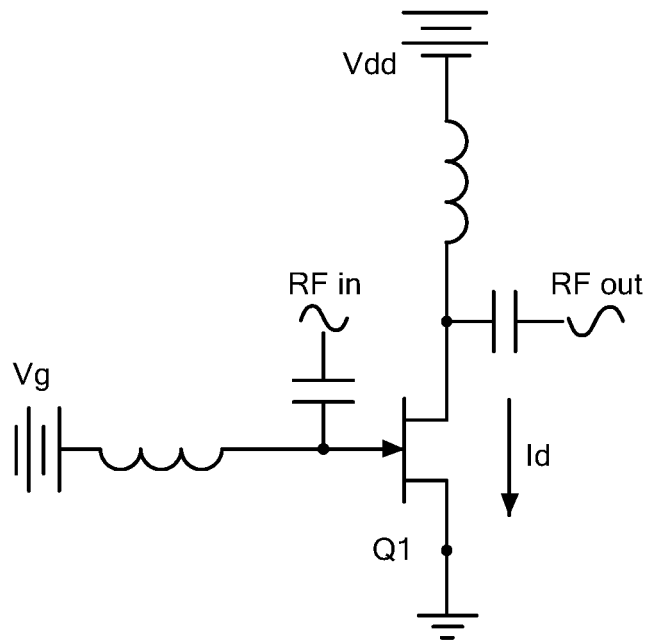
FIG. 1 is a circuit diagram of a prior art amplifier.
Figure 2:
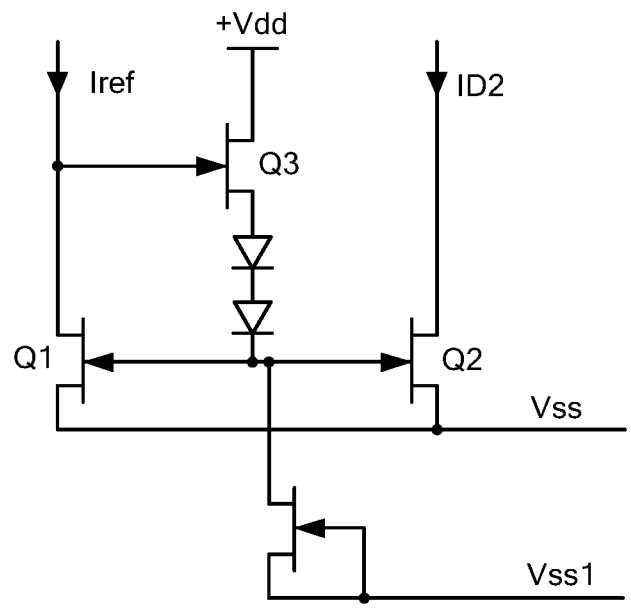
FIG. 2 is a circuit diagram of a prior art current mirror configuration.
Figure 3:
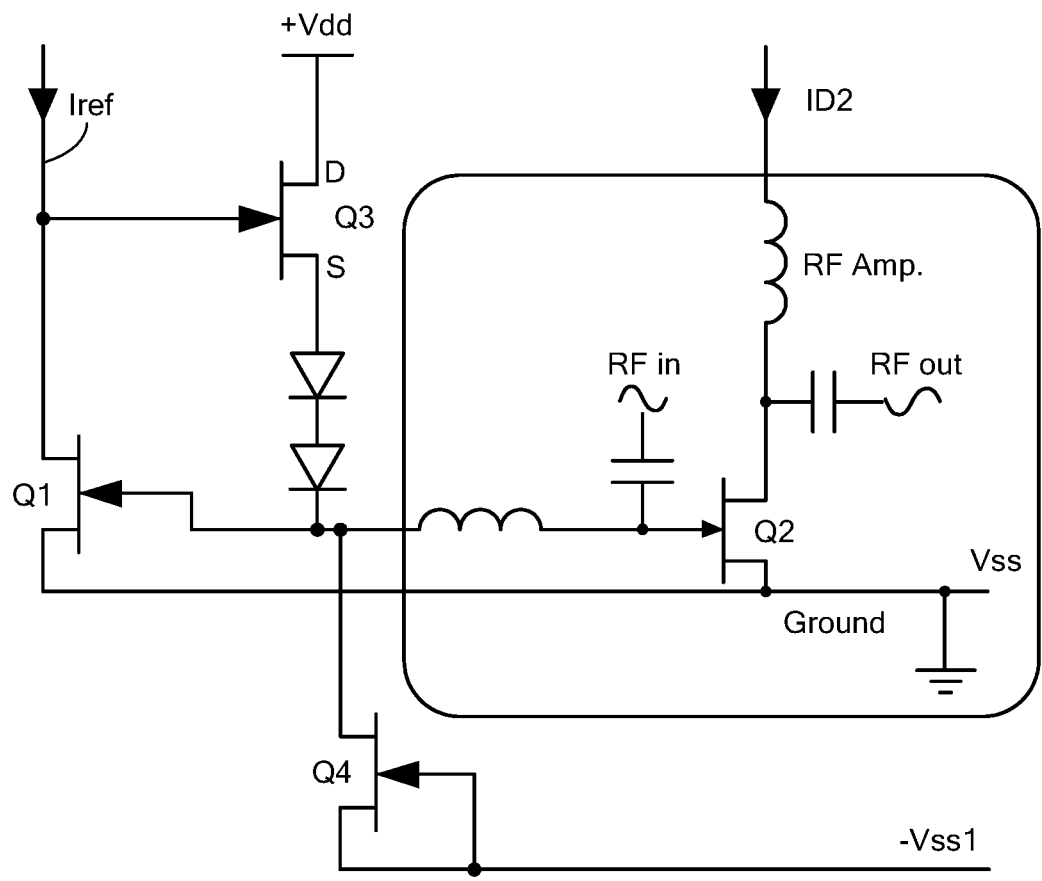
FIG. 3 is a circuit diagram of a prior art amplifier and current mirror configuration.
Figure 4:
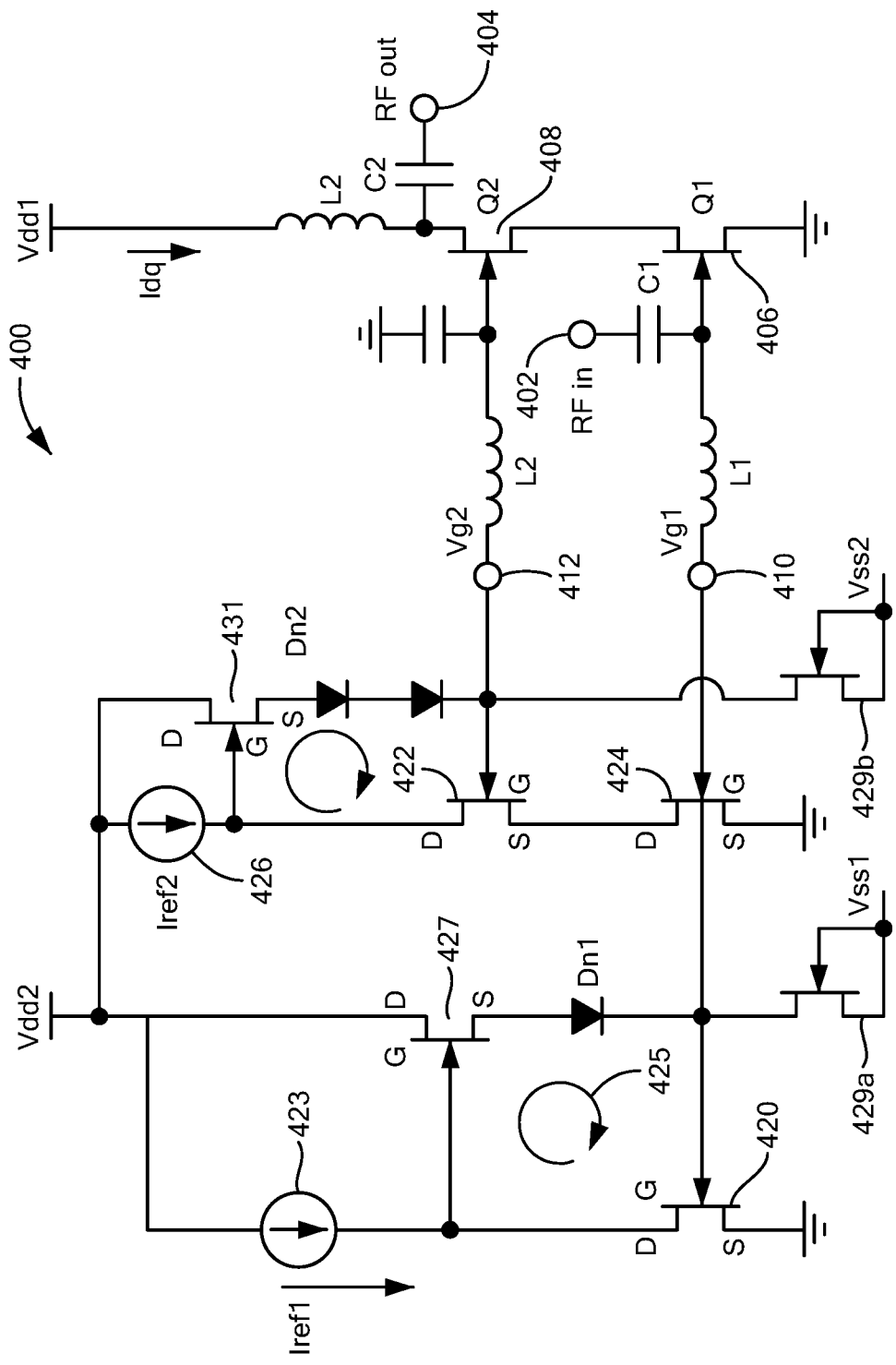
FIG. 4 is a circuit diagram of an amplifier and bias circuit in accordance with example embodiments of the disclosure.

FIG. 4 shows an example amplifier 400 having an input 402 and an output 404. Example embodiments of the disclosure may be well-suited for RF amplifier applications. The amplifier 400 includes a first transistor 406 and a second transistor 408 which may be configured in a cascode/stacked arrangement coupled in series from a voltage supply Vdd1 to ground.

In embodiments, the first transistor 406 is biased by a first bias signal Vg1 410 and the second transistor 408 is biased by a second bias signal Vg2 412. In the illustrated embodiment, first and second current mirrors are used to provide the bias signals to the first and second transistors 406, 408.

A first mirror transistor 420 is coupled to the first transistor 406 of the amplifier and a second mirror transistor 422 is coupled to the second transistor 408 of the amplifier. The first and second mirror transistors 420, 422 provide first and second control loops, as described more fully below, for a bias circuit to set amplifier quiescent bias. The first mirror transistor 420 and a first fixed current reference 423 in a first control loop 425 establish quiescent in the first (common source FET) transistor 406 of the amplifier. A voltage output of the first mirror transistor 420 goes to a reference transistor 424 for establishing the source potential for the common gate reference in the second mirror transistor 422. In embodiments, the second mirror transistor 422 (the common gate reference FET in the second mirror circuit) has a drain current from a second fixed current reference 426. The output of the second current mirror 422 may go to the second transistor 408 (top or common gate FET in the cascode/stacked FET network).

Figure 6:
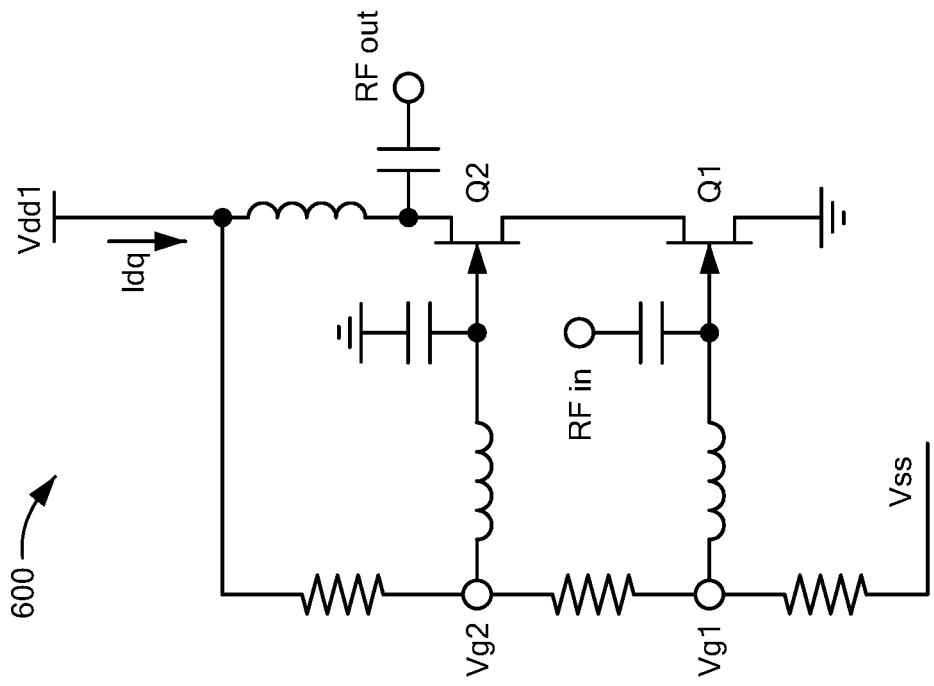
FIG. 6 is a circuit diagram of a prior art amplifier bias circuit.
Figure 5:
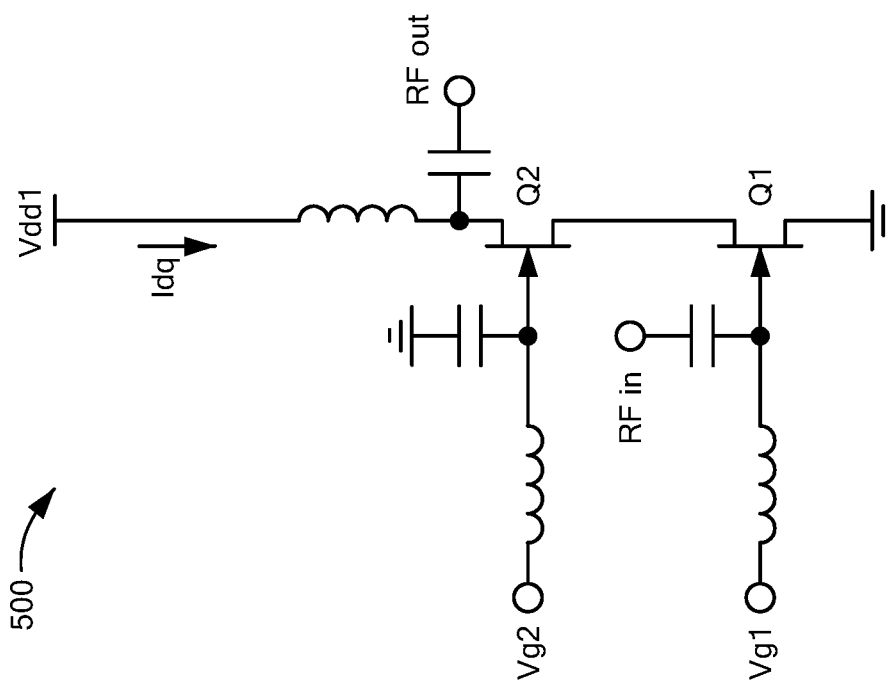
FIG. 5 is a circuit diagram of a prior art amplifier bias circuit.

FIG. 5 shows a prior art circuit 500 for a depletion mode cascode amplifier. Typically, quiescent conditions are set by directly applying voltages Vg1 and Vg2 to the stacked FETs Q1, Q2 from DC supplies. FIG. 6 shows a prior art circuit having a separate voltage divider circuit to derive Vg2 and Vg1. In these conventional arrangements, Vgs2 and Vg1 must be tuned on a per circuit basis due to inherent process variations.

In contrast, embodiments of the disclosure have follower networks with referenced feedback that result in a lower input impedance for the bias circuit which maintains quiescent voltages at Vg1 and Vg2 as the RF amplifier transitions between small signal and large signal operation. Diodes can be substituted by resistors if applications desire higher input impedances.

The example embodiment of FIG. 4 is described more fully below. In example embodiments, the current mirrors 420, 422 positive non-inverting current mirrors. The first mirror comprises a first transistor FET Q1 420 where the drain is fed by the first reference current Iref 423. It is noted that FET Q1 420 is placed into saturation so that the current between its source (S) and drain (D) is substantially constant with variations in the voltage across its source (S) and drain (D). The first transistor 406 of the amplifier is provided having its gate electrode (G) connected to the gate electrode of FET Q1 420 via reference transistor 424, where the current through the drain electrode of transistor FET 406, can be regulated by the value Iref 423. It is noted that FET 420 and FET 406 are both placed into saturation.

The drain electrode (D) of FET 420 is coupled to its gate electrode (G) through a follower network comprised of FET 427 and a network comprising one or more serially coupled diodes, here, for example, diode Dn1, and another serial element, here a transistor load 429, as shown. The source electrode of FET 420 is coupled to ground potential, as indicated. The gate electrode (G) of FET 420, with the follower network produces an output which is fed to the gate electrode of the depletion-mode FET 406 of the RF amplifier. The gate electrode (G) of FET 406 is fed an input RF signal RFin. It is noted that since the FET 406 is here a depletion-mode FET, its gate electrode (G) is typically DC biased at a potential more negative than ground potential.

In the illustrated embodiment, FET 420 has its drain electrode (D) coupled to the first current reference 423 and to the gate electrode (G) of FET 427, as shown. The drain electrode (D) of FET 427 is also connected to Vdd2. The gate electrode (G) of FET 420 is connected to the source electrode (S) of FET 427 through diode Dn1, as shown. The source electrode (S) of FET 420 is connected to ground. The gate electrode (G) of FET 420 is also connected to the gate electrode (G) of amplifier FET 406 through an RF blocking inductor L1 and to Vss1 through FET 429a connected as a current source load resistance, as shown.

The gate electrode (G) of FET 406 is also RF coupled to an RF input signal, RFin through a DC blocking capacitor C1, as indicated. The source electrode (S) of FET 406 is connected to ground. The drain electrode (D) of FET 406 is coupled to the source(S) of amplifier FET 408 in a stacked arrangement. An RF blocking inductor L2 is coupled to the output RFout through DC blocking capacitor C2, as indicated. In the illustrated embodiment, the FETs are depletion-mode FETs (D-FETS).

The second mirror includes FET 422 coupled to the gate (G) of FET 431 in a follower configuration with series-coupled diodes Dn2. The gate electrode (G) of FET 422 is also connected to the gate electrode (G) of amplifier FET 408 through an RF blocking inductor L2 and to Vss2 through FET 429b connected as a current source load resistance, as shown The drain (D) of FET 422 is coupled to the second current source 426. The source (S) of FET 422 is connected to the drain (D) of FET 424. FET 424 source potential (S) is ground reference and its gate potential is set by the first current mirror. The output of the second mirror provides the bias signal Vg2 412 to the second transistor 408 in the stacked FET amplifier. As noted above, the first and second current mirrors are referenced to each other via the reference FET 424.

It is understood that that Vss1 and Vss2 can be at the same or different reference potentials. A reference potential may be less than ground reference or one may be less than ground reference and the other may be a more positive potential, ie., ground. It is further understood that any practical number of diodes can be used and that resistors can be used stead of, or in combination with, diodes in a follower configuration. It is further understood that any practical number of transistors can be used in stacked amplifier embodiments with respective control loops.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A circuit, comprising:
   an amplifier including first and second transistors coupled in a stacked configuration;
   a first current mirror having a first control loop and a first mirror transistor coupled to a terminal of the first transistor to provide a first bias current, wherein the first current mirror includes the first mirror transistor, a first fixed current source, and a first follower transistor coupled to the first mirror transistor in a follower configuration;
   a second current mirror having a second control loop and a second mirror transistor coupled to a terminal of the second transistor to provide a second bias current; and
   a reference transistor coupled to the first and second current mirrors.

2. The circuit according to claim 1, wherein the second current mirror includes the second mirror transistor, a second fixed current source, and a second follower transistor coupled to the second mirror transistor in a follower configuration.

3. The circuit according to claim 1, wherein the reference transistor is coupled to the first mirror transistor and the second mirror transistor.

4. The circuit according to claim 1, wherein the first control loop further includes at least one diode.

5. The circuit according to claim 1, wherein an output of the first current mirror is configured to establish a source potential for a common gate reference of the second current mirror.

6. The circuit according to claim 5, wherein the common gate reference of the second current mirror has a drain current from a second fixed current source.

7. The circuit according to claim 1, wherein the amplifier comprises a depletion mode FET amplifier.

8. The circuit according to claim 1, wherein the amplifier comprises an RF amplifier.

9. A method, comprising:
   employing an amplifier including first and second transistors coupled in a stacked configuration;
   employing a first current mirror having a first control loop and a first mirror transistor coupled to a terminal of the first transistor to provide a first bias current, wherein the first current mirror includes the first mirror transistor, a first fixed current source, and a first follower transistor coupled to the first mirror transistor in a follower configuration;
   employing a second current mirror having a second control loop and a second mirror transistor coupled to a terminal of the second transistor to provide a second bias current; and
   employing a reference transistor coupled to the first and second current mirrors.

10. The method according to claim 9, wherein the second current mirror includes the second mirror transistor, a second fixed current source, and a second follower transistor coupled to the second mirror transistor in a follower configuration.

11. The method according to claim 9, wherein the reference transistor is coupled to the first mirror transistor and the second mirror transistor.

12. The method according to claim 9, wherein the first control loop further includes at least one diode.

13. The method according to claim 9, wherein an output of the first current mirror is configured to establish a source potential for a common gate reference of the second current mirror.

14. The method according to claim 13, wherein the common gate reference of the second current mirror has a drain current from a second fixed current source.

15. The method according to claim 9, wherein the amplifier comprises a depletion mode FET amplifier.

16. The method according to claim 9, wherein the amplifier comprises an RF amplifier.

17. A circuit comprising:
   an input terminal configured to receive an RF input signal;
   an output terminal configured to output an RF output signal;

an amplifier coupled to the input terminal and the output terminal, the amplifier including first and second transistors coupled in a stacked configuration;

a first current mirror having a first control loop and a first mirror transistor coupled to a terminal of the first transistor to provide a first bias current, wherein the first current mirror includes the first mirror transistor, a first fixed current source, and a first follower transistor coupled to the first mirror transistor in a follower configuration;

a second current mirror having a second control loop and a second mirror transistor coupled to a terminal of the second transistor to provide a second bias current; and a reference transistor coupled to the first and second current mirrors.

18. The circuit of claim 17, wherein an output of the first current mirror is configured to establish a source potential for a common gate reference of the second current mirror.

19. The circuit of claim 18, wherein the common gate reference of the second current mirror has a drain current from a second fixed current source.

20. The circuit of claim 17, wherein the second current mirror includes the second mirror transistor, a second fixed current source, and a second follower transistor coupled to the second mirror transistor in a follower configuration.

* * * * *